United States Patent
Ganz

(10) Patent No.: US 7,868,690 B2
(45) Date of Patent: Jan. 11, 2011

(54) COMPARATOR WITH SENSITIVITY CONTROL

(75) Inventor: Ruediger Ganz, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 318 days.

(21) Appl. No.: 12/199,380

(22) Filed: Aug. 27, 2008

(65) Prior Publication Data
US 2009/0153240 A1    Jun. 18, 2009

Related U.S. Application Data

(60) Provisional application No. 61/016,882, filed on Dec. 27, 2007.

(30) Foreign Application Priority Data

Aug. 29, 2007    (DE) .................. 10 2007 040 856

(51) Int. Cl.
*H03D 1/00*    (2006.01)

(52) U.S. Cl. ............... 329/347; 329/349; 341/126; 341/135; 327/67; 327/205

(58) Field of Classification Search ............ 341/126, 341/135; 329/347, 349; 327/67, 205; 340/870.21
See application file for complete search history.

(56) References Cited

U.S. PATENT DOCUMENTS

| | | | |
|---|---|---|---|
| 6,894,542 B2 * | 5/2005 | Prexl et al. | 327/67 |
| 7,579,906 B2 * | 8/2009 | Kumar et al. | 329/364 |
| 2006/0002429 A1 | 1/2006 | Doddamane et al. | |

FOREIGN PATENT DOCUMENTS

DE    102004009037 A1    6/2005

\* cited by examiner

*Primary Examiner*—Arnold Kinkead
(74) *Attorney, Agent, or Firm*—William B. Kempler; Wade J. Brady III; Frederick J. Telecky, Jr.

(57) ABSTRACT

A comparator has a differential input stage, a current source coupled to the differential input stage for providing a tail current to one side of the differential input stage, and a differential load coupled to the differential pair and having at least one diode coupled load transistor per differential side. A load current through either one of the at least one diode coupled load transistor on either differential side is mirrored with a current mirror configuration to provide a current be fed to a respective node, each node being coupled to a respective variable biasing current source and a respective other side of the differential input stage, so as to provide a variable positive feedback to the differential input stage.

13 Claims, 4 Drawing Sheets

COMPARATOR WITH SENSITIVITY CONTROL

This application claims the benefit of application Ser. No. 61/016,882 filed on Dec. 27, 2007, which is incorporated herein in its entirety by reference.

FIELD OF THE INVENTION

The present invention generally relates to a comparator, and more particularly to a comparator circuit for use in an RFID transponder demodulator circuit.

BACKGROUND OF THE INVENTION

Comparators can be used as 1 bit analog to digital converters (ADCs), which may serve for example as demodulators in RFID transponders. Generally, the comparator's signal input amplitudes can vary substantially thereby affecting the integrity of the comparison result. A rather sensitive comparator may respond to a signal input that is near to the decision threshold by an undesired change of the output signal whereas a rather robust comparator may not respond to input signal changes in a sufficiently sensitive manner. Variable sensitivity can be achieved with a comparator that has an adjustable hysteresis. The hysteresis of a comparator is a function of the current through the input stage of the comparator. Accordingly, the current through the input stage is varied. This is performed stepwise with a switchable load, which is coupled to the input stage, a principle that is only applicable as long as the supply voltage range of the comparator and the modulation depth of the signal are large and the steps are acceptable. However, for up-to-date technologies the supply voltage is reduced and the conventional comparator architectures are inappropriate.

SUMMARY OF THE INVENTION

It is a general object of the present invention to provide a comparator that is suitable for use in a technology that allows only reduced supply voltage levels to be used and that is suitable for smooth sensitivity adaptation.

Accordingly, one aspect of the present invention provides a comparator which comprises a differential input stage, a current source coupled to the differential input stage for providing a tail current to one side of the differential input stage, and a differential load coupled to the differential pair. The differential load comprises a diode coupled transistor per differential side. A load current to either one of the at least one diode coupled load transistors on either differential side is mirrored out with a current mirror configuration to provide a current to be fed to a respective node, each of which is coupled to a respective variable biasing current source and a respective other side of the differential input stage, so as to provide a variable positive feedback to the differential input stage. The ratio of the current mirror can have a factor A, such that the diode coupled load transistor has a width, which is A times the width of the respective mirroring transistor. A differential input voltage is input to the differential input stage, which is provided with a tail current from the current source. Using a current mirror arrangement, load current from the differential load, which is coupled to the differential pair, is mirrored, and a current is derived that is fed into its respective node, with the nodes being arranged so as to be coupled to respective variable biasing current sources. The mirrored load current fed to the nodes is used to provide a variable positive feedback to the differential input stage. The positive feedback results in a hysteresis, which is controlled by modulating the feedback using the variable biasing current sources. In other words, hysteresis in the comparator requires a positive feedback, which is provided here in the input stage of the comparator. This is achieved by using a current derived from the opposite side of the differential input stage. The positive input receives a current from the negative input branch and vice versa. Hysteresis control is then achieved by modulating the feedback current with the help of an external control signal. The present invention thus provides a comparator with a controlled variable hysteresis, controlled by an external signal.

According to an aspect of the present invention, the comparator can be used in a demodulator stage of an RFID transponder. The RFID transponder may have an antenna for receiving an RF signal including an amplitude modulated downlink data signal, and a demodulating stage coupled to the antenna for receiving a derived RF signal, which is derived from the received RF signal. The demodulating stage may comprise a first filter for extracting a field strength signal component from a derived RF signal and a second filter for extracting the modulated downlink data signal component from the derived RF signal. A demodulator may be provided, which is coupled to the second filter to receive the modulated downlink signal for demodulating the modulated downlink data signal component and coupled to the first filter to receive this field strength signal such that the demodulator is adapted to vary a demodulation sensitivity parameter in response to the field strength signal. An RF signal is received at the transmitter in the downlink stage of the transponder. The RF signal is split into two components—a first component, the field strength signal component, which is a slow varying DC component, and a second component, which is the modulated downlink data signal component. The field strength component is extracted by the first filter and the downlink data signal component is extracted by the second filter. Before the RF signal is split into the two components by the two respective filters, it is converted into a derived RF signal by the demodulating stage. The demodulator is then adapted to receive the two split-off components of the derived RF signal. Using the field strength signal, the demodulator can then vary the demodulation sensitivity parameter in accordance with the field strength signal extracted from the derived RF signal. Thus, the field strength signal (as an indicator of received signal strength (RSSI)) is used to demodulate the modulated downlink data signal component of the derived RF signal. The present invention provides the advantage of a demodulator that can be realized in a deep sub-micron process, for example in a 13 MHz transponder, which is used in applications such as tagging and electronic passports. This demodulator is able to operate with a much lower antenna limiter threshold, under the conditions that such small deep sub-micron processes demand. It is no longer required to perform demodulation using the antenna voltage envelope, as with prior art designs.

A limiter may be coupled between the antenna and the demodulating stage. The limiter can be adapted to act fast enough to suppress amplitude variations due to the modulated downlink data signal included in the received RF signal in a limited internal supply signal. The first filter and the second filter can be coupled with an input to the limiter for receiving, as the derived RF signal, an internal control signal of the limiter, which reflects the amplitude variations that are to be prevented by the limiter. The modulated downlink data signal is a very fast-varying, high-frequency signal that carries the relevant data in the received RF signal. The limiter allows this signal to be limited in voltage to such a degree, that it can then be rectified by a rectifying circuit and used as the internal supply signal for the transponder. Thus the derived RF signal is in fact the internal control signal of the limiter, which reflects the amplitude variations. This signal can be fed directly to the demodulating stage; i.e., the first filter and the second filter. In other words, the limiter is used to stimulate the demodulating stage. Using such a fast limiter means that any modulation drops in the antenna voltage envelope usable for a demodulation are not maintained. This means that the envelope demodulation of prior art designs is no longer required.

The limiter may comprise an NMOS transistor coupled between the antenna and ground level. The gate potential of the NMOS transistor is then controlled so as to limit the output voltage of the limiter. Further, the input of the first filter and the input of the second filter can be coupled to the gate of the NMOS transistor. The input source for the demodulating stage is then the gate voltage of the NMOS transistor in the limiter.

Advantageously, the demodulator as described hereinabove comprises the comparator according to the present invention and the demodulation sensitivity parameter can be an input related hysteresis of the comparator. The demodulator then includes a receive signal strength indication, provided by a field strength signal input, used for a sensitivity control. This method of sensitivity control ensures field strength independence. The comparator implements a hysteresis depending on the field strength signal output from the first filter and used as the signal sensitivity control. The hysteresis window is enlarged if the DC offset of the derived RF signal (the field strength signal) is high and vice versa.

The variable biasing current source of the comparator may comprise two transistors, having their gates coupled together for being commonly controlled by a control voltage. The hysteresis control performed by applying the variable biasing current to the nodes coupled to differential input stage is achieved by applying a single control voltage to a node interconnecting the gates of the two transistors forming a variable biasing current source. This allows modulation of the mirrored load current to be achieved at both nodes using just one control signal.

BRIEF DESCRIPTION OF THE DRAWINGS

Further advantages and characteristics of the invention ensue from the description below of a preferred embodiment, and from the accompanying drawings, in which:

FIG. 1 shows a circuit diagram of the comparator according to the invention. The comparator has a differential input stage implemented by two NMOS transistors MN1 and MN2. The transistors MN1 and MN2 have interconnected source terminals, which are connected at their interconnection node with a tail current source $I_{scr}$, which is also connected to ground. The drain terminals of the transistors MN1 and MN2 are connected to nodes N2 and N1, respectively, and also to the drain terminals of diode-connected PMOS transistors MP3 and MP4, respectively. The transistors MP3 and MP4 form a differential load and are coupled in current mirror arrangements with respective PMOS transistors MP6 and MP7. The transistors MP3 and MP6, as well as the transistors MP7 and MP4, all have their source terminals interconnected with each other. The ratio of MP3 to MP6 and MP4 to MP7 is 1:A. Gate terminals of the transistors MP3 and MP6 are interconnected, as are the gate terminals of the transistors MP7 and MP4, so as to provide a current mirror configuration with a ratio A. An interconnection of the gate terminals of the transistors MP3 and MP6 is connected to the node N2 and an interconnection of the gate terminals of the transistors MP7 and MP4 is connected to the node N1. The drains of the transistors MP6 and MP4; i.e., one PMOS transistor from each current mirror stage, are connected to the node N1, and the drain terminals are transistors MP3 and MP7 are connected to the node N2. A node interconnecting the drain of the transistor MP6 with the node N1 is connected to the drain terminal of an NMOS transistor MN8 and a node interconnecting the node N2 with the drain terminal of the transistor MP7 is connected to the drain terminal of an NMOS transistor MN9. Transistors MN8 and MN9 form a variable biasing current source adapted to bias the node N1 and N2, respectively, with a bias current $I_{cntl}$ and have interconnected gate terminals operable to receive a control voltage Bias_$I_{cntl}$, with the source terminals of the transistors MN8 and MN9 being connected to ground.

The gate terminals of the differential input stage formed by the transistors MN1 and MN2 are operable to receive differential input signals InN and InP respectively. The output voltage of the first differential input stage comprising the transistors MN1 and MN2 is output at the nodes N2 and N1, respectively. Load currents, I3 and I4 output from the diode-connected load transistors MP3 and MP4 respectively is mirrored at the respective current mirror transistors MP6 and MP7, which produces the currents I6 and I7 that are respectively fed to the nodes N1 and N2. The currents I6 and I7 provide a positive feedback to the differential input stage comprising the transistors MN1 and MN2. This results in a hysteresis voltage $V_{hyst}$ being generated.

Figure 1:
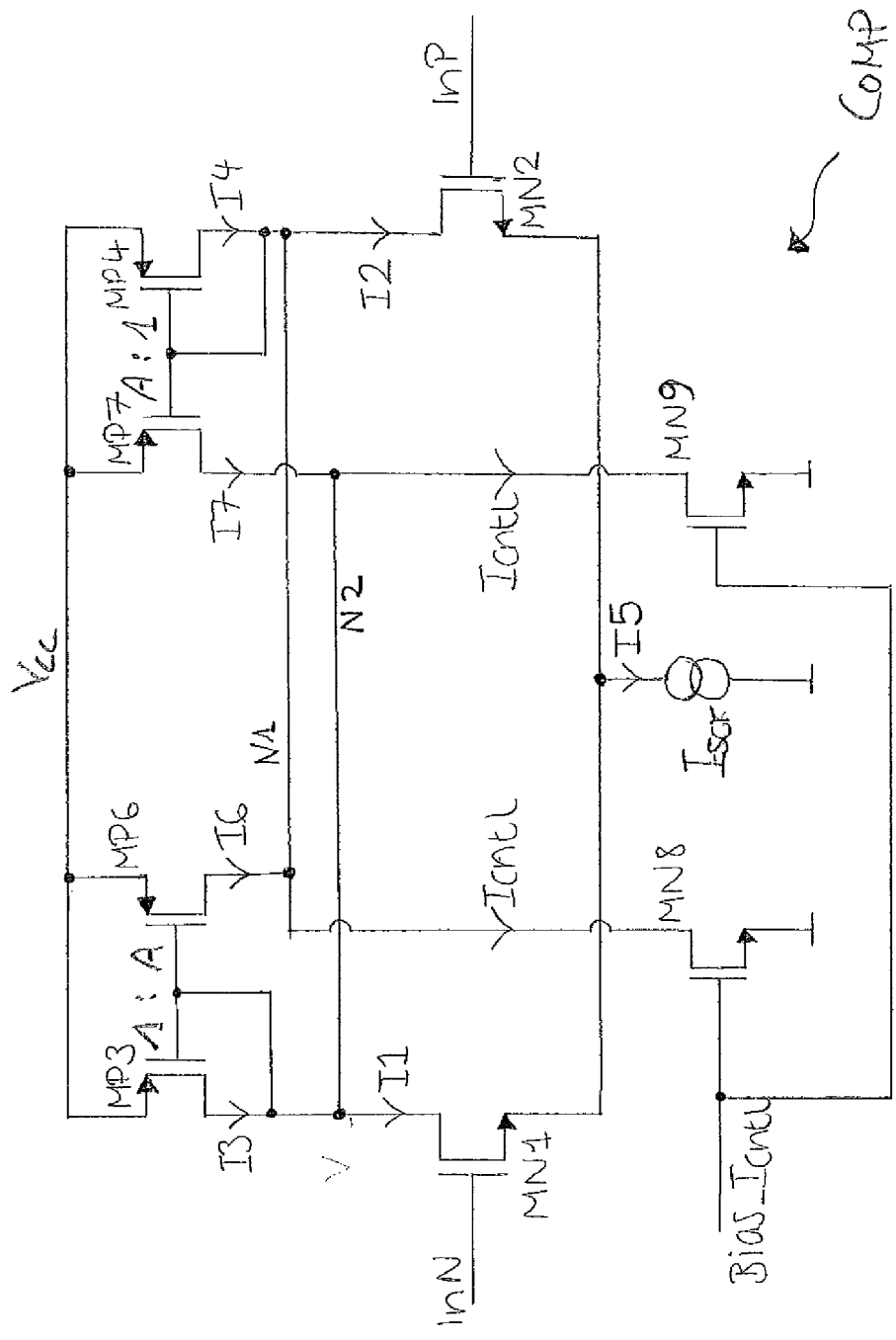
FIG. 1 is a simplified circuit diagram of a comparator according to the invention.
Figure 2:
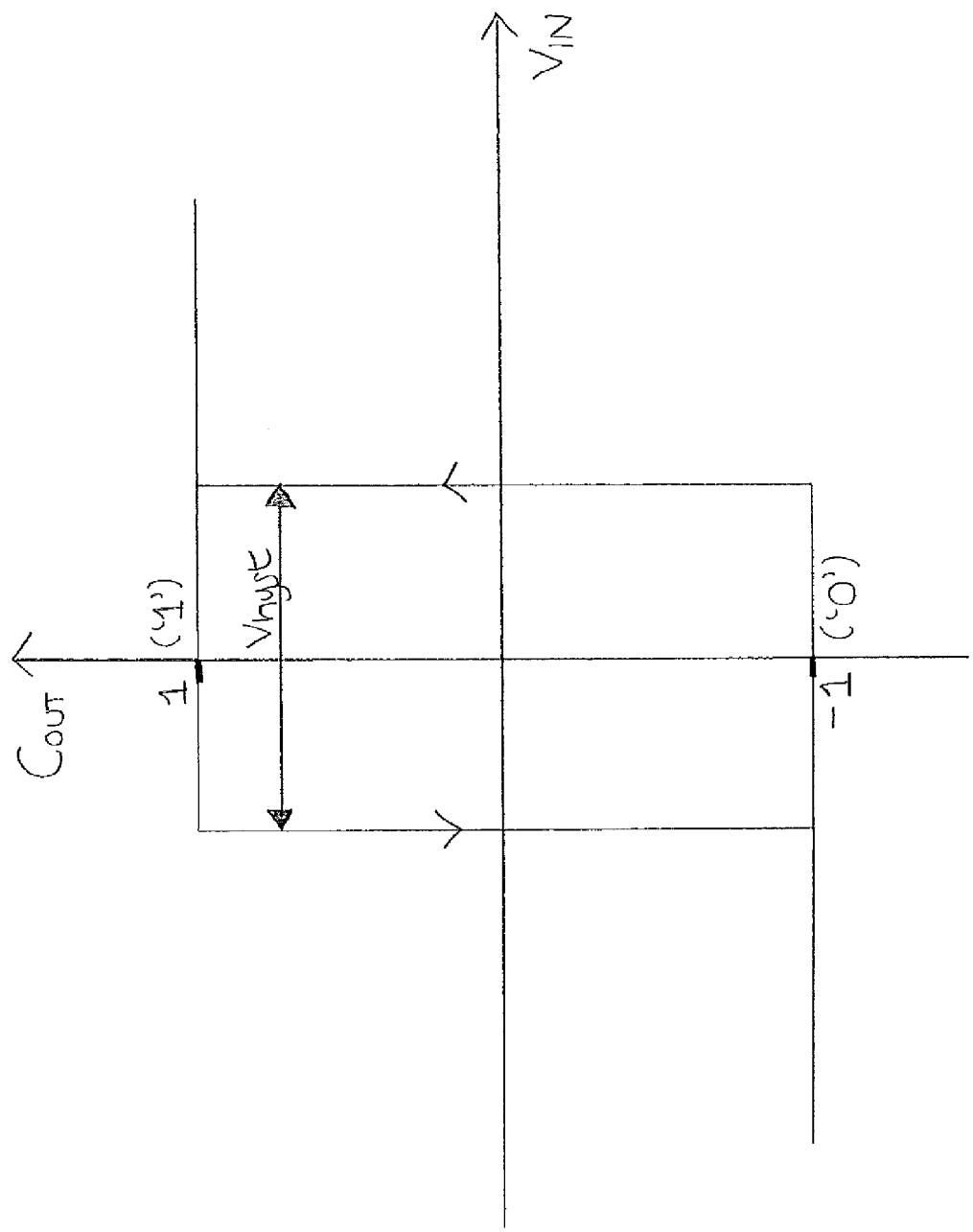
FIG. 2 is a simplified graph illustrating the comparator output signal as a function of the comparator input voltage.

FIG. 2 shows a graph illustrating the output of the comparator $C_{OUT}$ as a function of the input voltage to the comparator $V_{IN}$. The output of the comparator $C_{OUT}$ varies between 1 and −1, which corresponds to the logic levels '1' and '0', respectively. The hysteresis voltage $V_{hyst}$ is the difference between the values of the input voltage $V_{IN}$ at which the logical output of the comparator $C_{OUT}$ switches from '1' to '0', and vice versa, and is a measure of the sensitivity of the comparator. If the comparator is required to have a greater degree of sensitivity, the hysteresis window should be made smaller; i.e., the hysteresis voltage $V_{hyst}$ should be decreased. If, on the other hand, the comparator is only required to have a low sensitivity, the hysteresis window should be increased, which means increasing the hysteresis voltage $V_{hyst}$. The hysteresis of the comparator is controlled by applying the bias current $I_{cntl}$ from the transistors M8 and M9, derived from the control voltage Bias_$I_{cntl}$ to the nodes N1 and N2, respectively. The bias current $I_{cntl}$ modulates the positive feedback current from the output of the transistors M6 and M7 to the respective nodes N2 and N1. This results in a variation in the hysteresis voltage hysteresis $V_{hyst}$ can be varied and the sensitivity of the comparator can be adjusted in accordance with the required application.

A circuit analysis to determine the trip point of the hysteresis voltage $V_{hyst}$ is given below. At the starting condition of the comparator, the transistor MN1 is conducting and the transistor MN2 is off in the differential pair. The signal input is then lifted from a level below InN to a level above InM. This means that $$I1 = I3 - I_{cntl} \quad (1)$$

and $$I6 = A*I3, \quad (2)$$

wherein A is the width to length ratio of MP6 to MP3 and MP7 to MP4.

The trip point is reached if the transistor MN2 takes over the complete current of the feedback path through the transistor MP6, then $$I2 = I6 - I_{cntl} \quad (3)$$

$$I2 = A*I3 - I_{cntl} \quad (4)$$

and $$I5 = I1 + I2 \quad (5)$$

where I5 is the tail current of the differential pair of transistors MN1 and MN2. Then $$I5 = I3 - I_{cntl} + A*I3 - I_{cntl} \quad (6)$$

$$I5 = I3*(1+A) - 2*I_{cntl} \quad (7)$$

$$I5 = (I1 + I_{cntl})(1+A) - 2*I_{cntl} \quad (8)$$

$$\rightarrow I1 = (I5 - I_{cntl}(A-1))/(1+A) \quad (9)$$

$$\rightarrow I2 = I5 - I1 \quad (10)$$

This gives $$Vgs1(I_{cntl}) := \sqrt{\frac{I1(I_{cntl})}{\beta}} + vt \quad (11)$$

and $$Vgs2(I_{cntl}) := \sqrt{\frac{I2(I_{cntl})}{\beta}} + vt \quad (12)$$

with $\beta = \frac{1}{2}*K'*W/L$ wherein K' is technology specific, and where $Vgs1(I_{cntl})$ and $Vgs2(I_{cntl})$ are the gate-source voltages of the differential pair of input transistors MN1 and MN2, respectively.

The hysteresis voltage $V_{hyst}$ as a function of the bias current $I_{cntl}$ is then defined by:

$$V_{hyst}(I_{cntl}) := 2(Vgs2(I_{cntl}) - Vgs1(I_{cntl})) \quad (13)$$

Figure 3:
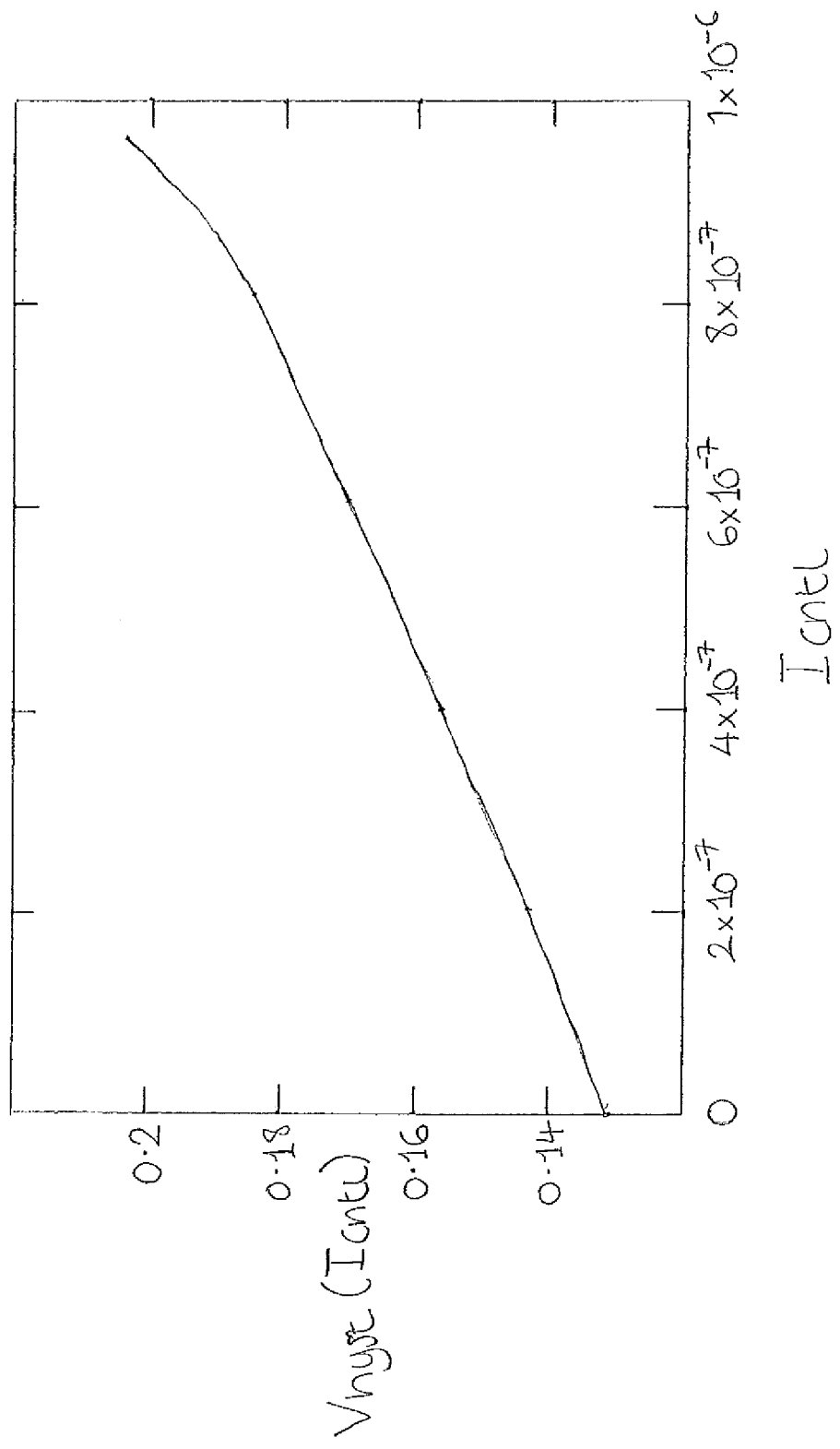
FIG. 3 is a simplified graph of the hysteresis voltage of the comparator according to the invention as a function of control current.

FIG. 3 shows a graph of the hysteresis voltage $V_{hyst}$ as a function of the control (bias) current $I_{cntl}$, provided by the bias current source consisting of the transistors MN8 and MN9, for A=5, I5=5×10$^{-6}$ A, and $\beta$=3*10$^{-4}$ A/V². It can be seen that the hysteresis voltage $V_{hyst}$ can be increased by increasing the bias current $I_{cntl}$ (thereby making the hysteresis window larger and decreasing the comparator sensitivity) and conversely decreased by decreasing the bias current $I_{cntl}$ (thereby making the hysteresis window smaller and increasing the comparator sensitivity. Thus, if it is wished to have an increased sensitivity for the comparator, the bias current $I_{cntl}$ should be reduced, which means reducing the control voltage Bias_$I_{cntl}$ fed to the gates of the transistors MN8 and MN9, respectively. Therefore, even when the signal conditioning requirements of the antenna signal vary by several orders of magnitude due to field strength variations, a field strength dependent correction can be achieved by controlling the comparator hysteresis, or in other words by controlling the sensitivity of the comparator operating as one bit analog-to-digital converter merely by altering the control voltage Bias_$I_{cntl}$.

Figure 4:
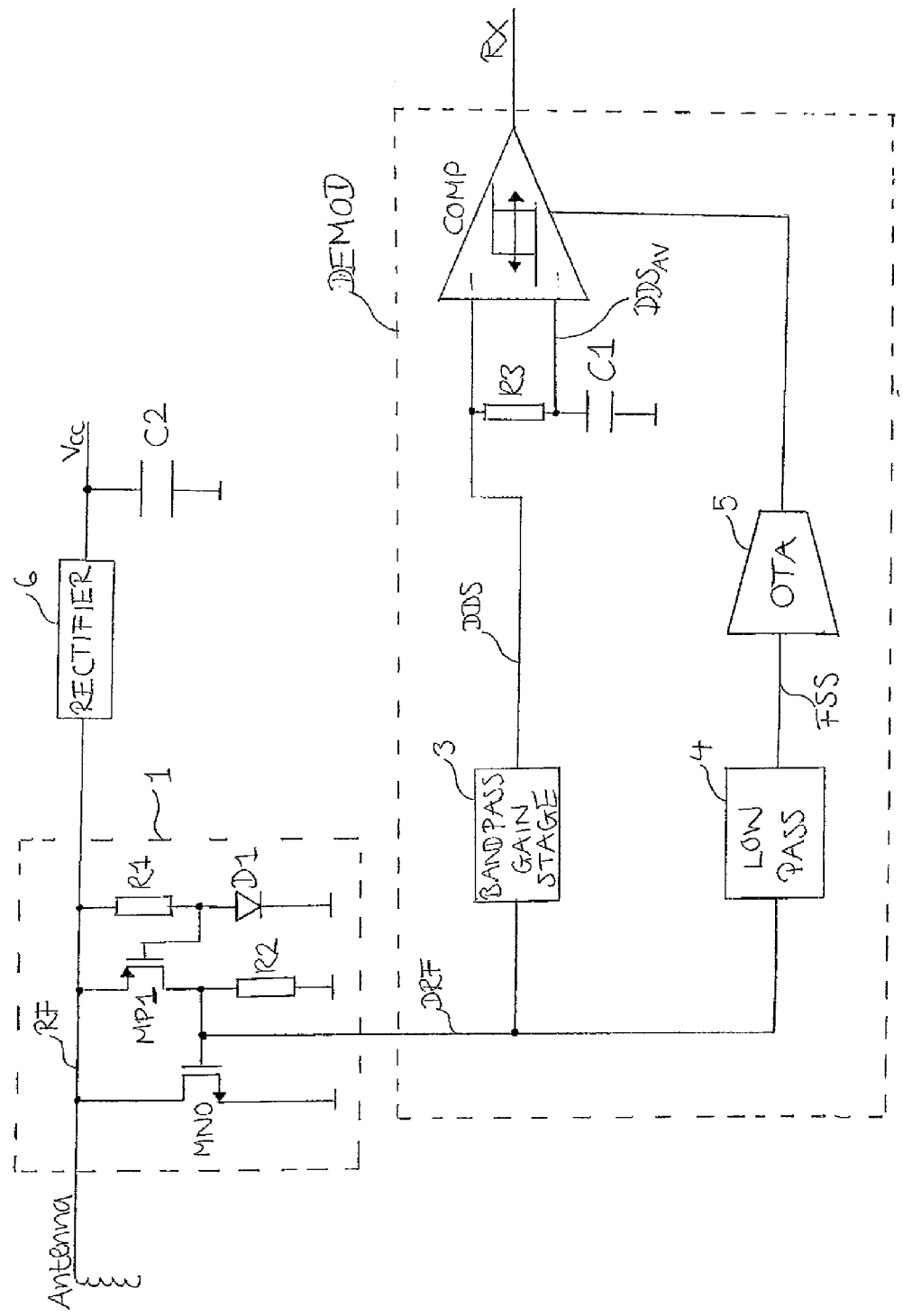
FIG. 4 is a simplified circuit diagram of the downlink stage of an RFID transponder with a comparator according to the invention.

FIG. 4 shows the downlink part of an RFID transponder with a comparator COMP according to the invention having a limiter circuit 1 and a demodulating stage DEMOD. An antenna coil Antenna is operable to receive an RF signal and is coupled to a voltage rail RF. The limiter circuitry 1 has an NMOS transistor MN0, with drain and source terminals coupled to the voltage rail RF and ground, respectively. The gate terminal of the transistor MN0 is connected to the drain of a PMOS transistor MP1, which has its source connected to the voltage rail RF. The drain of the transistor MP1 is connected in series with a resistor R2. Resistor R2 is also connected to ground. A resistor R1 is connected in series with a diode D1 so that the resistor is coupled to the voltage rail RF and the diode is connected to ground such that it is forward biased in a direction from the resistor R1 to ground. A node interconnecting the resistor R1 and the diode D1 is connected to the gate terminal of the transistor MP1. A node interconnecting the gate terminal of the transistor MN0, the drain terminal of the transistor MP1, and the resistor R2 is connected to the demodulating stage DEMOD. This node forms a voltage node DRF. The voltage node DRF is connected to a band pass gain stage filter 3 and a low pass filter 4. Low pass filter 4 is connected to the control input of a comparator COMP and the band pass gain stage 3 is connected directly to one input of the comparator COMP. The other input of the comparator COMP is connected via a resistor R3 to the output of the band pass gain stage and a node interconnecting the resistor R3 and the comparator input to which it is connected is connected to a capacitor C1, which is also connected to ground. The arrangement comprising the resistor R3 and the capacitor C1 is configured to provide an average value of the output of the band pass gain stage 3 to the one input of the comparator COMP, for comparison with the actual value of the band pass gain stage 3 input to the other input of the comparator COMP. The output of the comparator is adapted to provide the demodulated downlink data signal RX.

The limiter circuitry 1 is also connected to a rectifier 6 and a buffering capacitor C2. A node interconnecting the rectifier 6 and the capacitor C2 is the supply voltage node Vcc.

When an RF signal is received at the antenna, it induces a voltage in the voltage rail RF. The limiting circuitry, including the clamping transistors MN0 and MP1 act very quickly to suppress amplitude variations due to the modulated downlink data signal included in the received RF signal. The limiter 1 switches on the transistor MN0 if the voltage increases above a predetermined limit. Since the transistor MN0 is an additional load, current flows through the transistor MN0 and the voltage at the voltage rail RF is reduced. This provides a limited voltage which is then rectified by the rectifier 6 and buffered by the capacitor C2 to provide a limited internal supply voltage at the voltage rail Vcc.

At the same time, using the gate voltage of the transistor MN0 coupled to the band pass gain stage 3 and the low pass filter 4 in the demodulating stage DEMOD, the limiter circuit 1 provides a derived RF signal DRF derived from the received RF signal, which is in fact the gate voltage of the transistor MN0. The band pass filter 3 amplifies the modulated part of the limiter gate voltage, which is the amplitude modulated downlink data signal DDS (the high frequency signal that carries data component of the received RF signal). The field strength dependent DC offset of the received RF signal and a superimposed 13 MHz carrier signal are filtered out. The band pass filter 3 also shifts the signal to a suitable operating point. The comparator COMP then compares the output of the band pass filter 3, representing the actual gate voltage of the transistor MN0 in the limiter 1, with the average value of the amplitude modulated downlink data signal DDS, $DDS_{AV}$. If the actual value of the modulated downlink data signal DDS falls below the average value $DDS_{AV}$, a demodulated output signal RX is output from the comparator COMP, which represents the damped state of the antenna voltage at the voltage rail RF.

The sensitivity of the comparator COMP must be independent of the field strength or the distance between the transponder and a reader unit. However, the amplitude of the modulated downlink data signal DDS in fact varies with the field strength. If the RFID transponder is close to the read/write unit, the field strength is high, the amplitude variation is large and the amount of noise compared to the amplitude of the signal is small. In this case a reduced sensitivity is required. On the other hand, if the transponder is further away from the read/write unit, the amplitude of the signal is small and the noise is then large compared to the maximum amplitude. This means that a field strength dependent correction is needed. The field strength dependent correction is provided using the field strength signal component FSS of the received RF signal. Low pass filter 4 filters out the field strength signal component FSS from the derived RF signal DRF so that it delivers only the field strength dependent DC offset from the derived RF signal DRF (the gate voltage of the transistor MN0 in the limiter circuit 1). By filtering out the modulated downlink data signal DDS and the carrier frequency part of the received RF signal, only the field strength information is maintained. The operational transconductance amplifier 5, which is an optional feature, transfers the field strength signal components FSS output from the low pass filter 4 into a field strength dependent current, which is then used for sensitivity correction of the comparator COMP. The comparator COMP implements a hysteresis depending on the output of the OTA 4 via the signal sensitivity control provided by the field strength signal component FSS. The hysteresis window is enlarged if the DC offset of the limiter voltage is high or vice versa. At high field strength, the actual value at the band pass filter 3 has a high amplitude. The conversion into the digital demodulated signal RX output by the comparator COMP is done in this example with a reduced sensitivity (enlarged hysteresis window), which compensates for the higher amplitude of the actual value. At low field strength, the derived RF signal DRF has a low DC offset and a low amplitude of the modulated downlink data signal DDS. The sensitivity of the comparator can be increased by reducing the hysteresis window. Control of the comparator sensitivity is then performed in a feed forward manner. Therefore, a stable demodulator sensitivity is provided independent of the field strength. The sensitivity control signal used to control the comparator COMP is derived from the received RF signal, therefore it is a receive strength indication, which can be used also for other purposes, for example charge pump enabling.

Although the present invention has been described hereinabove with reference to a specific embodiment, it is not limited to this embodiment and no doubt further alternatives will occur to the skilled person that lie within the scope of the invention as claimed.

The invention claimed is:

1. A comparator for demodulating an amplitude modulated RF signal received in an RFID transponder, the comparator comprising:
a differential input stage (MN1, MN2),
a current source (Iscr) coupled to the differential input stage (MN1, MN2) for providing a tail current (I9) to the differential input stage (MN1, MN2), and
a differential load coupled to the differential input stage and comprising at least one diode coupled load transistor (MP3, MP4) per differential side, wherein
a load current (I3, I4) through either one of the at least one diode coupled load transistor (MP3, MP4) on either differential side is mirrored out with a current mirror configuration having a factor A to provide a current (I6, I7) be fed to a respective node (N1, N2), each node (N1, N2) being coupled to a respective variable biasing current source and a respective other side of the differential input stage (MN1, MN2), so as to provide a variable positive feedback to the differential input stage (MN1, MN2).

2. The comparator according to claim 1, wherein the variable biasing current source comprises two transistors (MN8, MN9) having their gates coupled together for being commonly controlled by a control voltage ($Bias\_I_{cntl}$).

3. The comparator according to claim 1, wherein the current mirror configuration is established by coupling two transistors (MP6, MP7) with their gates to the gates of the diode coupled load transistors.

4. A RFID transponder comprising:
an antenna;
a demodulator comprising:
a differential input stage having a differential load having at least one diode coupled transistor coupled to a differential pair of transistors, a load current through either one of the at least one diode coupled transistor being mirrored by a current mirror having a current ration of 1:A to provide current to a respective node, each node being coupled to a respective variable biasing current source and a respective other side of the differential input stage, whereby a variable positive feedback to the differential input stage is provided.

5. The transponder of claim 4 further comprising a current source coupled to the differential input stage providing a tail current.

6. The transponder of claim 4, wherein the variable biasing current source comprises two transistors (MN8, MN9) having their gates coupled together for being commonly controlled by a control voltage ($Bias\_I_{cntl}$).

7. The transponder of claim 5, wherein the variable biasing current source comprises two transistors (MN8, MN9) having their gates coupled together for being commonly controlled by a control voltage ($Bias\_I_{cntl}$).

8. The transponder of claim 3, wherein the current mirror configuration is established by coupling two transistors (MP6, MP7) with their gates to the gates of the diode coupled load transistors.

9. The transponder of claim 4, wherein the current mirror configuration is established by coupling two transistors (MP6, MP7) with their gates to the gates of the diode coupled load transistors.

10. The transponder of claim 5, wherein the current mirror configuration is established by coupling two transistors (MP6, MP7) with their gates to the gates of the diode coupled load transistors.

11. The transponder of claim 6, wherein the current mirror configuration is established by coupling two transistors (MP6, MP7) with their gates to the gates of the diode coupled load transistors.

12. The transponder of claim 7, wherein the current mirror configuration is established by coupling two transistors (MP6, MP7) with their gates to the gates of the diode coupled load transistors.

13. A comparator for demodulating an amplitude modulated RF signal received in an RFID transponder, the comparator comprising:

a differential input stage (MN1, MN2), a current source (Iscr) coupled to the differential input stage (MN1, MN2) for providing a tail current (I9) to the differential input stage (MN1, MN2); and a differential load coupled to the differential input stage and comprising at least one diode coupled load transistor (MP3, MP4) per differential side, wherein a load current (I3, I4) through either one of the at least one diode coupled load transistor (MP3, MP4) on either differential side is mirrored with a current mirror configuration having a factor A to provide a current (I6, I7) be fed to a respective node (N1, N2), each node (N1, N2) being coupled to a respective variable biasing current source and a respective other side of the differential input stage (MN1, MN2), so as to provide a variable positive feedback to the differential input stage (MN1, MN2);

wherein the variable biasing current source comprises two transistors (MN8, MN9) having their gates coupled together for being commonly controlled by a control voltage (Bias_$I_{cntl}$); and the current mirror configuration is established by coupling two transistors (MP6, MP7) with their gates to the gates of the diode coupled load transistors.

* * * * *